US009831397B2

(12) United States Patent
Theobald et al.

(10) Patent No.: US 9,831,397 B2
(45) Date of Patent: Nov. 28, 2017

(54) QUANTUM DOTS WITH MULTIPLE INSULATOR COATINGS

(71) Applicant: PACIFIC LIGHT TECHNOLOGIES CORP., Portland, OR (US)

(72) Inventors: Brian Theobald, Gladstone, OR (US); Matthew Bertram, Portland, OR (US); Weiwen Zhao, Happy Valley, OR (US); Juanita N. Kurtin, Hillsboro, OR (US); Norbert Puetz, Ottawa (CA)

(73) Assignee: Pacific Light Technologies Corp., Portland, OR (US)

( * ) Notice: Subject to any disclaimer, the term of this patent is extended or adjusted under 35 U.S.C. 154(b) by 0 days.

(21) Appl. No.: 15/064,491

(22) Filed: Mar. 8, 2016

(65) Prior Publication Data

US 2016/0268483 A1    Sep. 15, 2016

Related U.S. Application Data

(60) Provisional application No. 62/130,498, filed on Mar. 9, 2015, provisional application No. 62/158,449, filed on May 7, 2015.

(51) Int. Cl.
*H01L 33/50* (2010.01)
*H01L 33/56* (2010.01)
(Continued)

(52) U.S. Cl.
CPC ............ *H01L 33/502* (2013.01); *B82Y 20/00* (2013.01); *B82Y 40/00* (2013.01); *Y10S 977/774* (2013.01);
(Continued)

(58) Field of Classification Search
CPC ................. H01L 33/502; H01L 33/56; H01L 2933/0041; H01L 2933/005;
(Continued)

(56) References Cited

U.S. PATENT DOCUMENTS

2009/0315016 A1* 12/2009 Elam .................... B82Y 10/00
257/15
2011/0129537 A1   6/2011 Vo-Dinh et al.
(Continued)

OTHER PUBLICATIONS

Hakim, et al., "Nanocoating Individual Silica Nanoparticles by Atomic Layer Deposition in a Fluidized Bed Reactor," Chemical Vapor Deposition, Oct. 2005, vol. 11, No. 10, pp. 420-425.
(Continued)

*Primary Examiner* — Caridad Everhart
(74) *Attorney, Agent, or Firm* — Elliott, Ostrander & Preston, P.C.

(57) ABSTRACT

Fabricating a semiconductor structure including forming a nanocrystalline core from a first semiconductor material, forming a nanocrystalline shell from a second, different, semiconductor material that at least partially surrounds the nanocrystalline core, wherein the nanocrystalline core and the nanocrystalline shell form a quantum dot. Fabrication further involves forming an insulator layer encapsulating the quantum dot to create a coated quantum dot, and forming an additional insulator layer on the coated quantum dot using an Atomic Layer Deposition (ALD) process.

8 Claims, 7 Drawing Sheets

(51) Int. Cl.
*B82Y 20/00* (2011.01)
*B82Y 40/00* (2011.01)

(52) U.S. Cl.
CPC ........ *Y10S 977/824* (2013.01); *Y10S 977/893* (2013.01); *Y10S 977/95* (2013.01)

(58) Field of Classification Search
CPC ............. Y10S 977/824; Y10S 977/774; Y10S 977/893; Y10S 997/774; Y10S 997/824; Y10S 997/95; Y10S 997/893; Y01S 977/95; B82Y 40/00; B82Y 20/00
See application file for complete search history.

(56) References Cited

U.S. PATENT DOCUMENTS

| | | |
|---|---|---|
| 2012/0082728 A1 | 4/2012 | Schneider et al. |
| 2013/0112941 A1 | 5/2013 | Kurtin et al. |
| 2014/0166973 A1 | 6/2014 | Kurtin et al. |
| 2014/0264257 A1 | 9/2014 | Hughes et al. |
| 2016/0084476 A1* | 3/2016 | Koole .................... C09K 11/02 362/84 |
| 2016/0149097 A1* | 5/2016 | Saka ................... C23C 16/4417 257/98 |
| 2016/0333264 A1* | 11/2016 | Zhao .................... C09K 11/025 |

OTHER PUBLICATIONS

Pacific Light Technologies Corp., "International Search Report and Written Opinion", International Patent Application No. PCT/US2016/021605, (dated May 30, 2016).

* cited by examiner

QUANTUM DOTS WITH MULTIPLE INSULATOR COATINGS

CROSS-REFERENCE TO RELATED APPLICATIONS

This application claims the benefit of U.S. Provisional Application No. 62/130,498, filed Mar. 9, 2015, and U.S. Provisional Application No. 62/158,449, filed May 7, 2015, the entire contents of which are hereby incorporated by reference herein.

BACKGROUND

Atomic Layer Deposition (ALD) processes on individual metal-oxide coated quantum dots have not been previously attempted.

SUMMARY

A semiconductor structure is fabricated by first forming a nanocrystalline core from a first semiconductor material, then forming a nanocrystalline shell from a second, different, semiconductor material that at least partially surrounds the nanocrystalline core. The nanocrystalline core and the nanocrystalline shell form a quantum dot. An insulator layer is formed to encapsulate the quantum dot. The quantum dot thus coated is further coated with an additional insulator layer using an Atomic Layer Deposition (ALD) process.

DETAILED DESCRIPTION

Figure 1:
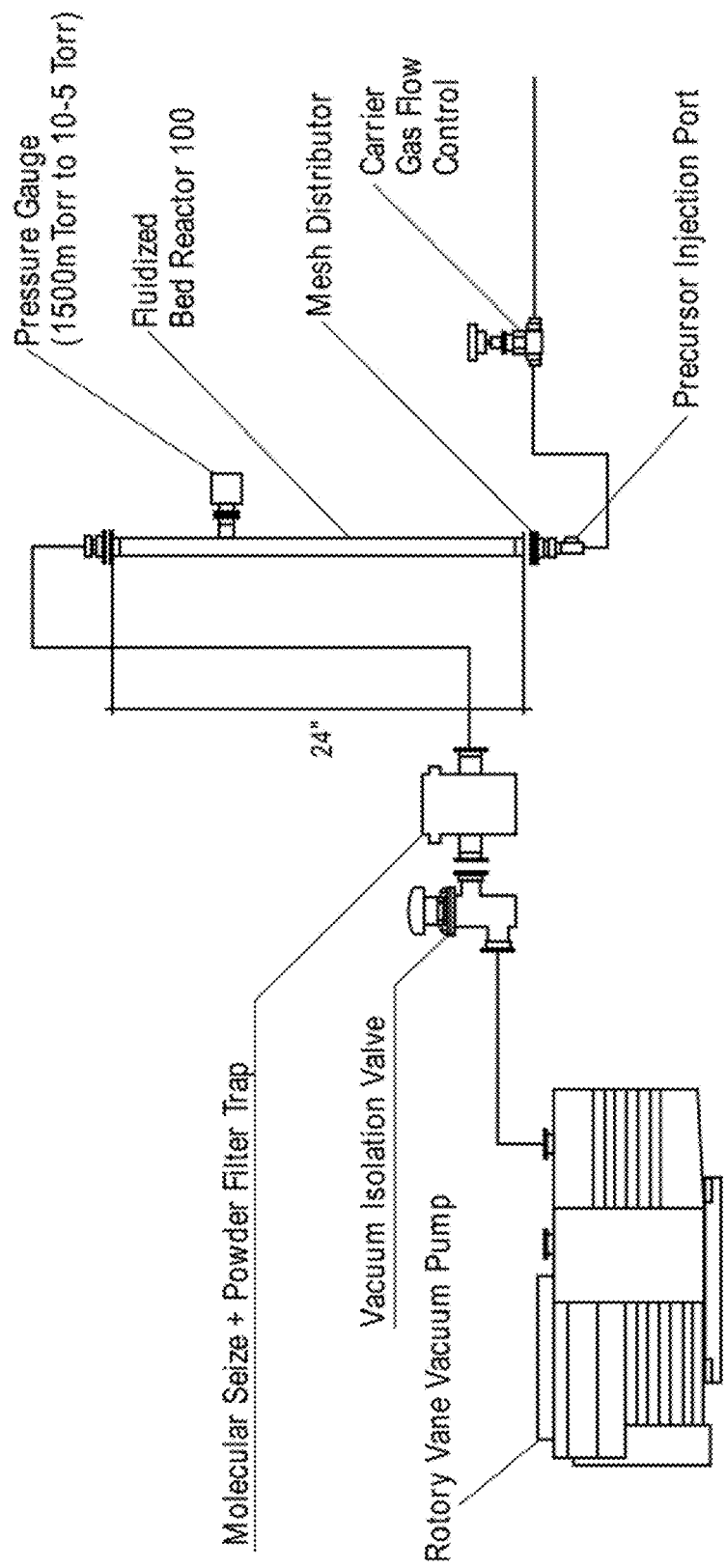
FIG. 1 is an illustration of an Atomic Layer Deposition system that may be used in accordance with an embodiment of the invention.

Embodiments of the invention involve the coating of quantum dot nanopowders by Atomic Layer Deposition (ALD) processes. ALD is used to conformally coat surfaces with atomic or molecular layers of material, and recent advances have allowed the ALD process to be applied to powders, for example by the use of fluidized bed ALD or similar methods. Embodiments of the invention involve the use of an ALD particle process where the powders are composed of silica-coated quantum dots in order to better protect the quantum dots from the effects of the environment. FIG. 1 illustrates a fluidized bed ALD reactor 100, into which quantum dot powders are placed, according to one embodiment of the invention.

Quantum dots are materials which are beneficial in many applications, but which often cannot withstand thousands of hours of operation under the environmental and operating conditions of many products, for example, light emitting diode (LED) or solar devices. According to embodiments of the invention, quantum dots are made robust for certain applications by individually coating the surfaces of the quantum dots with layers of metal oxide (for example silica, titania, alumina, etc.). An example of quantum dots with an insulator layer is described below with reference to FIG. 5. However, this layer may not be sufficient to protect the quantum dots in all operating or environmental conditions, due to the imperfect or porous coverage of the metal oxide. Adding an additional layer of metal oxide or other insulating material using the ALD process makes the quantum dots more robust by further protecting the surfaces and filling in any imperfections or pores.

Figure 2:
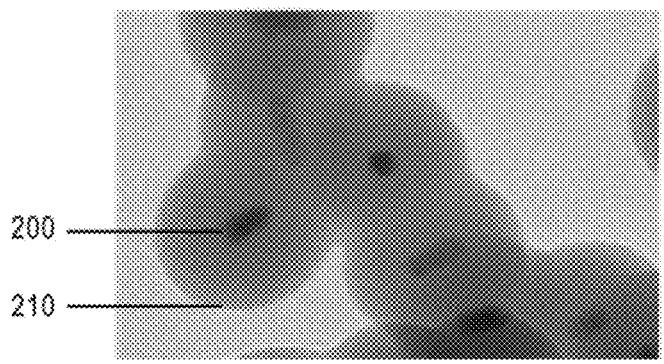
FIG. 2 is an image from a Transmission Electron Microscope (TEM) of a quantum dot coated with an insulator layer prior to further coating the quantum dot with another insulator layer by way of an ALD process according to an embodiment of the invention.

Additionally, in order to ensure that there is no self-quenching of photoluminescence or other interactions between or among quantum dots, in one embodiment, the first metal oxide insulator layer serves as an adjustable spacer that allows the quantum dots to remain fully dispersed and spaced apart prior to adding the second metal oxide coating via the ALD process. By adding a metal oxide shell by a reverse micelle or similar process, the individual quantum dots 200 are coated with enough material 210 to ensure adequate monodispersity, as seen in the Transmission Electron Microscope (TEM) image in FIG. 2, and avoid self-quenching.

Finally, metal oxide coating of quantum dots prior to the ALD coating renders the quantum dots more thermally stable so they can sustain a much higher ALD processing temperature than uncoated quantum dots. As one example, low temperature $Al_2O_3$ ALD films have lower film density than that of high temperature films. One problem for $Al_2O_3$ ALD conducted at low temperatures is that very long purge times for water removal are typically required to avoid $Al_2O_3$ Chemical Vapor Deposition (CVD) growth. $Al_2O_3$ ALD films grown at low temperatures also have higher hydrogen atomic concentration. Finally, low temperature ALD processes require a much longer time to deposit the ALD film. Therefore, the benefits of performing the higher temperature ALD process on thermally stable quantum dots, such as those that have already been coated with a metal oxide, can be significant.

Figure 3:
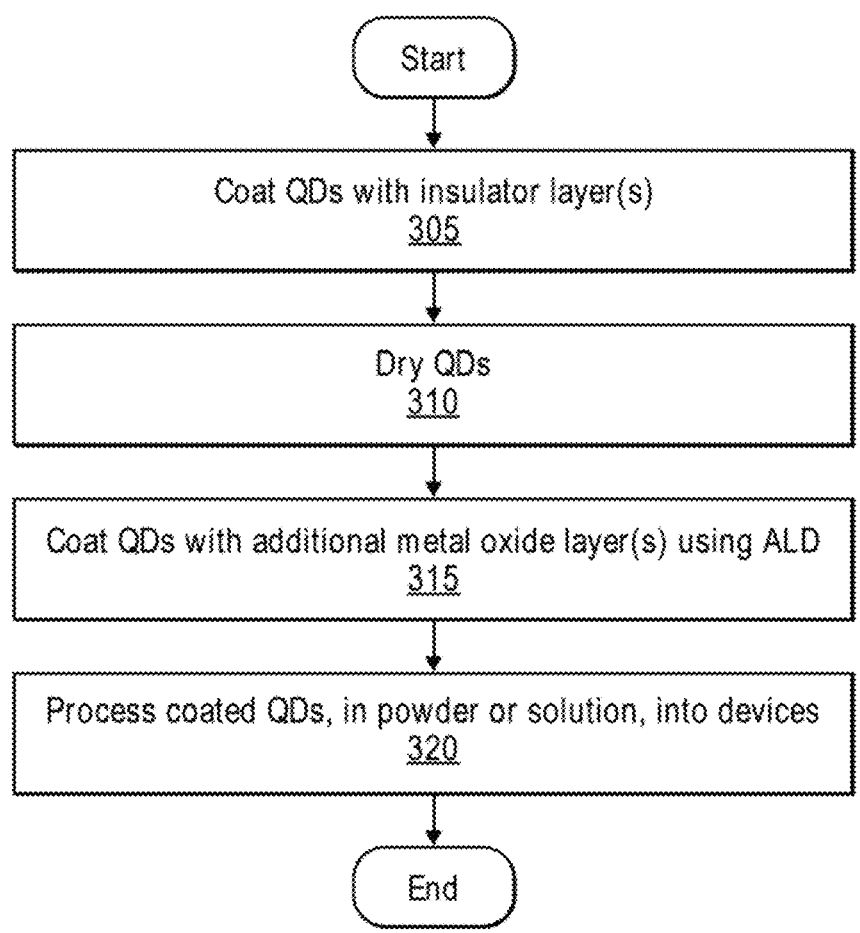
FIG. 3 is a flow diagram in accordance with an embodiment of the invention.
Figure 8:
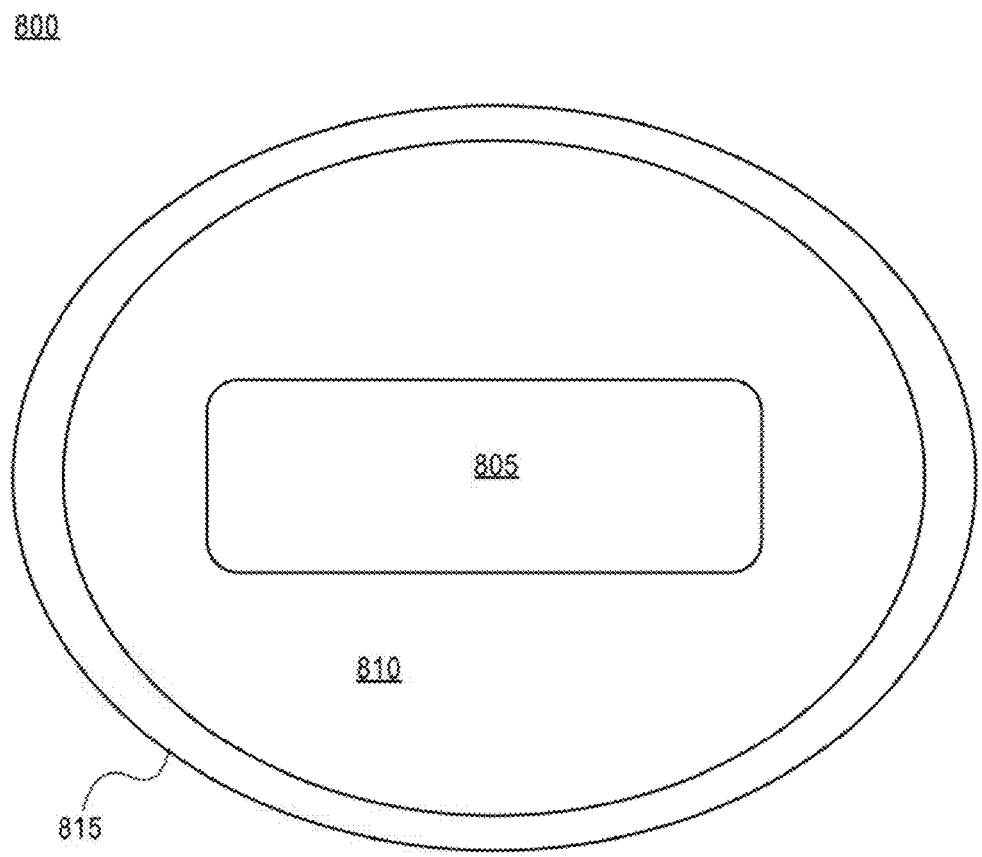
FIG. 8 illustrates a coated quantum dot fabricated according to an embodiment of the invention.

In one embodiment of the invention 300, with reference to the flow diagram in FIG. 3, and the structure 800 illustrated in FIG. 8, quantum dot heterostructure 802 is made and coated with an insulating layer 810, for example, a metal oxide layer, in solution, using methods such as the Stoeber or Igepal method, at 305. The coated quantum dots are then dried at 310 and introduced at 315 to a fluidized bed ALD reactor, where they are coated with an additional layer 815 of metal oxide using atomic layer deposition. The resulting material is handled either in powder or solution and processed into devices at 320.

With reference to FIG. 1, one embodiment of step 315 is now described. Quantum dot aggregates are coated using an ALD fluidized bed reactor system 100. The reactor is an electro polished stainless steel tube. The bottom of the reactor is fitted with a porous metal frit (20 um pore size). This frit functions as a gas diffusor. In one embodiment, the deposition reaction occurs under reduced pressure with ultrahigh purity argon as a carrier gas. The base system pressure is 10 mTorr. Quantum dot aggregates are loaded on top of the metal frit and the reactor is sealed. The reactor is heated to between 100-200 C. Trimethylaluminum and de-ionized water are injected into the bottom of the reactor into the carrier gas stream. These are injected sequentially as is typically done in an $Al_2O_3$ deposition process. The particles fluidize at 8 cm/s gas velocity, in one embodiment.

Figure 4:
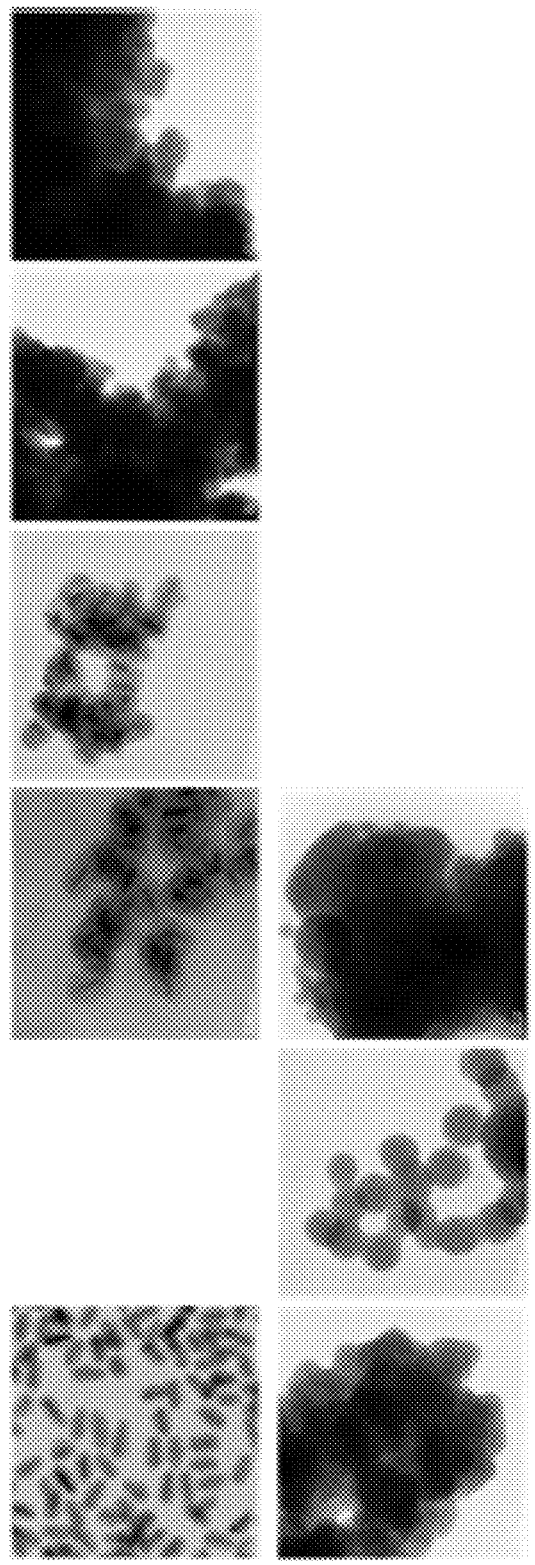
FIG. 4 provides TEM images 400 of quantum dot particles coated with metal oxide layers of varying thickness.

In another embodiment, multiple layers are applied during the ALD processing. In one such embodiment, the multilayers consist of alternating organic and inorganic layers that encapsulate the metal-oxide coated quantum dots. Examples of multilayer encapsulation include alternating layers of inorganic materials such as $Al_2O_3$, MgO, and $SiO_x$, and $SiN_x$ as well as transition metals including copper, cobalt, and iron deposited by ALD. Parylene is an exemplary organic layer in multilayer structures and may serve as the final layer due to its low modulus and hydrophobic nature. Also, a final layer of Parylene keeps water from condensing on the $Al_2O_3$ layer, which is known to corrode $Al_2O_3$. Being a relatively flexible polymer, Parylene may also help with stress relaxation during the addition of the multiple inorganic layers. Parylene can be introduced by vapor-phase deposition between or after the addition of the inorganic layers. The Parylene deposition can be done at room temperature, eliminating any risk of thermal damage to the samples. FIG. 4 provides TEM images 400 of quantum dot particles coated with metal oxide layers of varying thickness. Parylene is the trade name for a variety of chemical vapor deposited poly (p-xylylene) polymers.

Example of Quantum Dots with an Insulator Layer

As explained above, embodiments of the invention involve forming additional insulating layers over coated quantum dots using an ALD process. The following described embodiment is an example of coated quantum dots that may be further coated with additional insulating layers using an ALD process.

In a general embodiment, a semiconductor structure includes a nanocrystalline core composed of a first semiconductor material. The semiconductor structure also includes a nanocrystalline shell composed of a second, different, semiconductor material at least partially surrounding the nanocrystalline core. An insulator layer encapsulates, e.g., coats, the nanocrystalline shell and nanocrystalline core. Thus, coated semiconductor structures include coated structures such as the quantum dots described above. For example, in an embodiment, the nanocrystalline core is anisotropic, e.g., having an aspect ratio between, but not including, 1.0 and 2.0. In another example, in an embodiment, the nanocrystalline core is anisotropic and is asymmetrically oriented within the nanocrystalline shell. In an embodiment, the nanocrystalline core and the nanocrystalline shell form a quantum dot.

With reference to the above described coated nanocrystalline core and nanocrystalline shell pairings, in an embodiment, the insulator layer is bonded directly to the nanocrystalline shell. In one such embodiment, the insulator layer passivates an outermost surface of the nanocrystalline shell. In another embodiment, the insulator layer provides a barrier for the nanocrystalline shell and nanocrystalline core impermeable to an environment outside of the insulator layer.

In any case, the insulator layer may encapsulate only a single nanocrystalline shell/nanocrystalline core pairing. In an embodiment, the semiconductor structure further includes a nanocrystalline outer shell at least partially surrounding the nanocrystalline shell, between the nanocrystalline shell and the insulator layer. The nanocrystalline outer shell is composed of a third semiconductor material different from the semiconductor material of the shell and, possibly, different from the semiconductor material of the core.

With reference again to the above described coated nanocrystalline core and nanocrystalline shell pairings, in an embodiment, the insulator layer is composed of a layer of material such as, but not limited to, silica (SiOx), titanium oxide (TiOx), zirconium oxide (ZrOx), alumina (AlOx), or hafnia (HfOx). In one such embodiment, the layer is silica having a thickness approximately in the range of 3-30 nanometers. In an embodiment, the insulator layer is an amorphous layer.

In one embodiment, multiple insulator layers may be applied to the nanocrystalline shell/nanocrystalline core pairing. For example, various embodiments include from two to twelve insulator layers, before additional insulating layers are applied via the ALD process.

With reference again to the above described coated nanocrystalline core and nanocrystalline shell pairings, in an embodiment, an outer surface of the insulator layer is ligand-free. However, in an alternative embodiment, an outer surface of the insulator layer is ligand-functionalized. In one such embodiment, the outer surface of the insulator layer is ligand-functionalized with a ligand such as, but not limited to, a silane having one or more hydrolyzable groups or a functional or non-functional bipodal silane. In another such embodiment, the outer surface of the insulator layer is ligand functionalized with a ligand such as, but not limited to, mono-, di-, or tri-alkoxysilanes with three, two or one inert or organofunctional substituents of the general formula (R1O)3SiR2; (R1O)2SiR2R3; (R1O) SiR2R3R4, where R1 is methyl, ethyl, propyl, isopropyl, or butyl, R2, R3 and R4 are identical or different and are H substituents, alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a silane with the general structure (R1O)3Si—(CH2)n-R—(CH2)n-Si(RO)3 where R and R1 is H or an organic substituent selected from the group consisting of alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a chlorosilane, or an azasilane.

In another such embodiment, the outer surface of the insulator layer is ligand-functionalized with a ligand such as, but not limited to, organic or inorganic compounds with functionality for bonding to a silica surface by chemical or non-chemical interactions such as but not limited to covalent, ionic, H-bonding, or Van der Waals forces. In yet another such embodiment, the outer surface of the insulator layer is ligand-functionalized with a ligand such as, but not limited to, the methoxy and ethoxy silanes (MeO)3SiAllyl, (MeO)3SiVinyl, (MeO)2SiMeVinyl, (EtO)3SiVinyl, EtOSi (Vinyl)3, mono-methoxy silanes, chloro-silanes, or 1,2-bis-(triethoxysilyl)ethane.

In any case, in an embodiment, the outer surface of the insulator layer is ligand-functionalized to impart solubility, dispersability, heat stability, photo-stability, or a combination thereof, to the semiconductor structure. For example, in one embodiment, the outer surface of the insulator layer includes OH groups suitable for reaction with an intermediate linker to link small molecules, oligomers, polymers or macromolecules to the outer surface of the insulator layer, the intermediate linker one such as, but not limited to, an epoxide, a carbonyldiimidazole, a cyanuric chloride, or an isocyanate.

With reference again to the above described coated nanocrystalline core and nanocrystalline shell pairings, in an embodiment, the nanocrystalline core has a diameter approximately in the range of 2-5 nanometers. The nanocrystalline shell has a long axis and a short axis, the long axis having a length approximately in the range of 5-40 nanometers, and the short axis having a length approximately in the range of 1-5 nanometers greater than the diameter of the nanocrystalline core. The insulator layer has a thickness approximately in the range of 1-20 nanometers along an axis co-axial with the long axis and has a thickness approximately in the range of 3-30 nanometers along an axis co-axial with the short axis. In other embodiments, the thickness of the insulator layer may be greater than 30 nanometers, for example, up to 500 nanometers.

A lighting apparatus may include a light emitting diode and a plurality of semiconductor structures that, for example, act to down convert light absorbed from the light emitting diode. For example, in one embodiment, each semiconductor structure includes a quantum dot having a nanocrystalline core composed of a first semiconductor material and a nanocrystalline shell composed of a second, different, semiconductor material at least partially surrounding the nanocrystalline core. Each quantum dot has a photoluminescence quantum yield (PLQY) of at least 90%. An insulator layer encapsulates each quantum dot.

As described briefly above, an insulator layer may be formed to encapsulate a nanocrystalline shell and anisotropic nanocrystalline core. For example, in an embodiment, a layer of silica is formed using a reverse micelle sol-gel reaction. In one such embodiment, using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent. Subsequently, ammonium hydroxide and tetraorthosilicate (TEOS) are added to the second solution.

Figure 5:
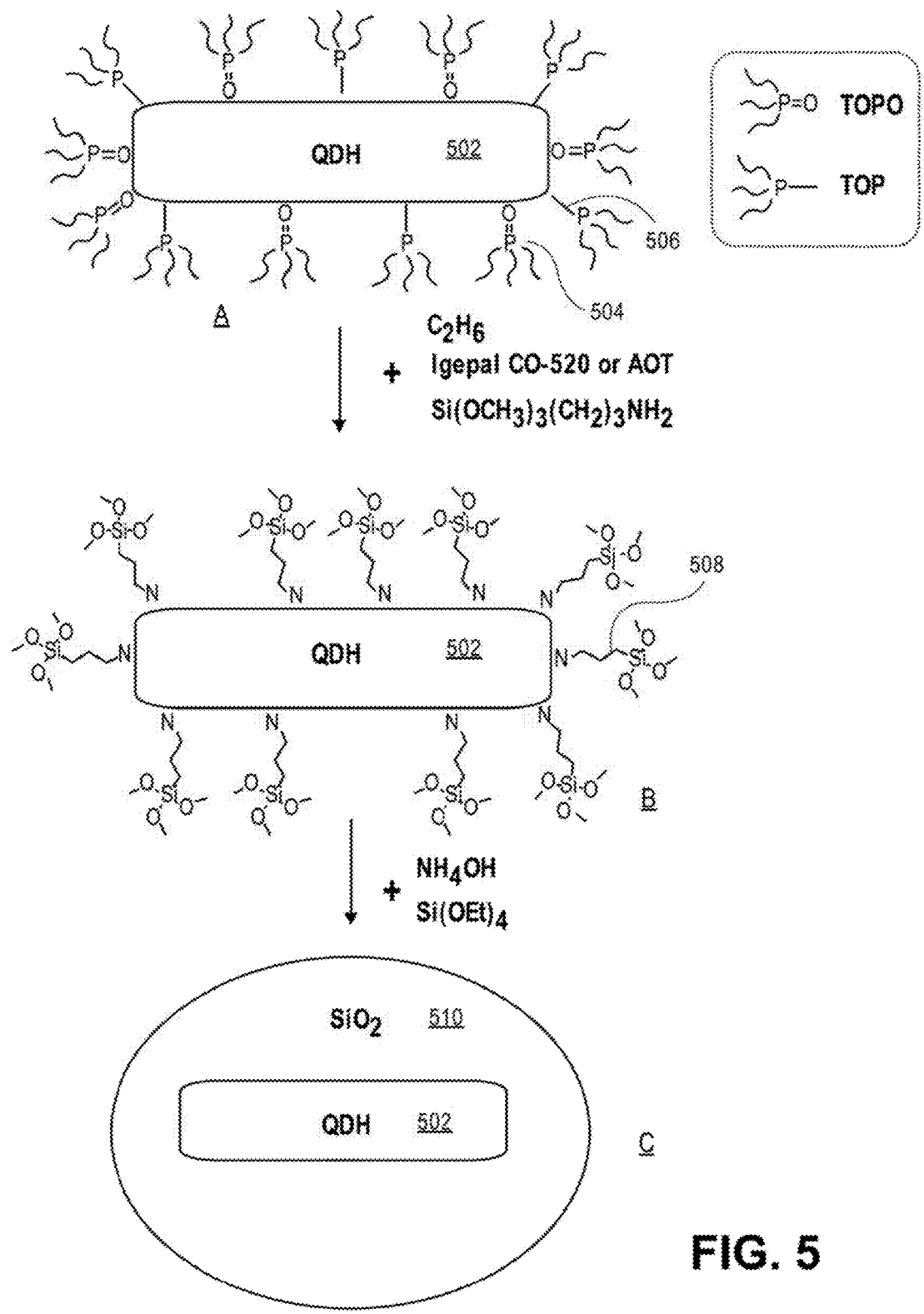
FIG. 5 provides an example of quantum dots with an insulator layer according to an embodiment of the invention.

Thus, semiconductor nanocrystals coated with silica according to the present invention may be made by a sol-gel reaction such as a reverse micelle method. As an example, FIG. 5 illustrates operations in a reverse micelle approach to coating a semiconductor structure, in accordance with an embodiment of the present invention. Referring to part A of FIG. 5, a quantum dot heterostructure (QDH) 502 (e.g., a nanocrystalline core/shell pairing) has attached thereto a plurality of TOPO ligands 504 and TOP ligands 506. Referring to part B, the plurality of TOPO ligands 504 and TOP ligands 506 are exchanged with a plurality of Si(OCH3)3(CH2)3NH2 ligands 508. The structure of part B is then reacted with TEOS (Si(OEt)4) and ammonium hydroxide (NH4OH) to form a silica coating 510 surrounding the QDH 502, as depicted in part C of FIG. 5.

With reference again to the above-described method of forming coated nanocrystalline core and nanocrystalline shell pairings, in an embodiment, the first and second non-polar solvents are cyclohexane. In an embodiment, forming the coating layer includes forming a layer of silica and further includes using a combination of dioctyl sodium sulfosuccinate (AOT) and tetraorthosilicate (TEOS). In another embodiment, however, forming the layer includes forming a layer of silica and further includes using a combination of polyoxyethylene (5) nonylphenylether and tetraorthosilicate (TEOS). In another embodiment, however, forming the layer includes forming a layer of silica and further includes using cationic surfactants such as CTAB (cetyltrimethylammonium bromide), anionic surfactants, non-ionic surfactants, or pluronic surfactants such as Pluronic F 127 (an ethylene oxide/propylene oxide block co-polymer) as well as mixtures of surfactants.

Upon initiation of growth of a silica shell, the final size of that shell may be directly related to the amount of TEOS in the reaction solution. Silica coatings according to embodiments of the present invention may be conformal to the core/shell QDH or non-conformal. A silica coating may be between about 3 nm and 30 nm thick. The silica coating thickness along the c-axis may be as small as about 1 nm or as large as about 20 nm. The silica coating thickness along the a-axis may be between about 3 nm and 30 nm. Once silica shelling is complete, the product is washed with solvent to remove any remaining ligands. The silica-coated quantum dots can then be incorporated into a polymer matrix or undergo further surface functionalization. However, silica shells according to embodiments of the present invention may also be functionalized with ligands to impart solubility, dispersability, heat stability and photo-stability in the matrix.

In another aspect, quantum dot composite compositions are described. For example, the quantum dots (including coated quantum dots) described above may be embedded in a matrix material to make a composite using a plastic or other material as the matrix. In an embodiment, composite compositions including matrix materials and silica coated core/shell quantum dots having photoluminescence quantum yields between 90 and 100% are formed. Such quantum dots may be incorporated into a matrix material suitable for down converting in LED applications.

Figure 6:
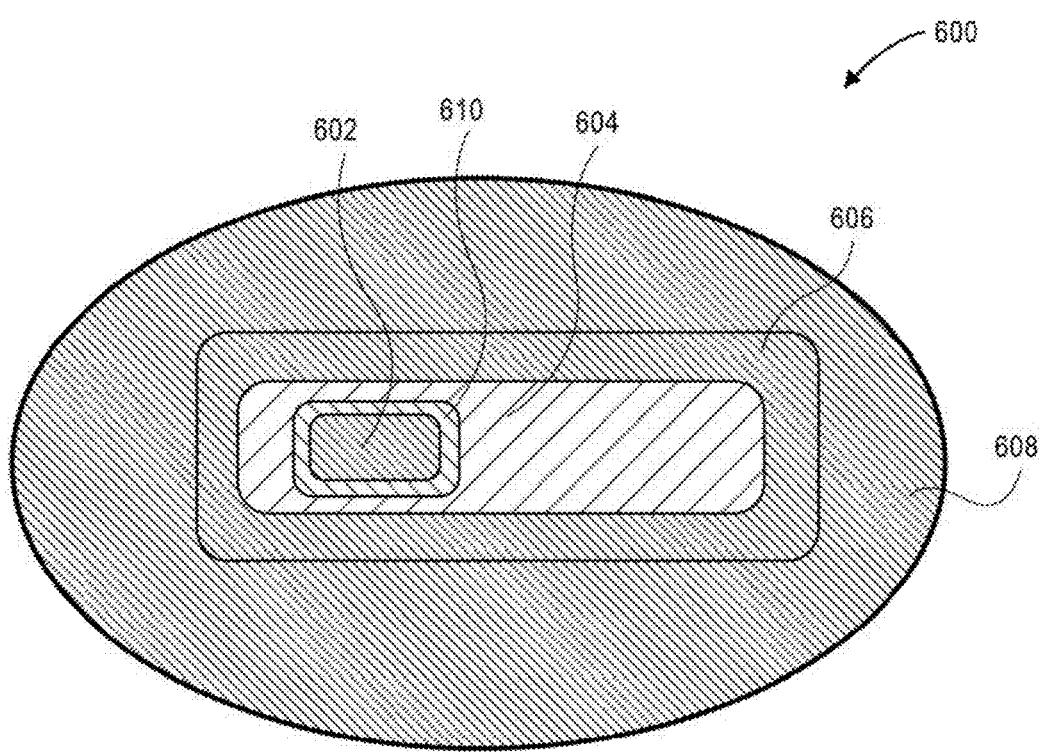
FIG. 6 is an illustration of a semiconductor structure that has a nanocrystalline core and nanocrystalline shell pairing with one compositional transition layer, in accordance with an embodiment of the invention.

In another example, and as illustrated in FIG. 6 below, a semiconductor structure has a nanocrystalline core and nanocrystalline shell pairing with one compositional transition layer, in accordance with an embodiment of the present invention.

Referring to FIG. 6, a semiconductor structure 600 includes a nanocrystalline core 602 composed of a first semiconductor material. A nanocrystalline shell 604 composed of a second, different, semiconductor material at least partially surrounds the nanocrystalline core 602. A compositional transition layer 610 is disposed between, and in contact with, the nanocrystalline core 602 and nanocrystalline shell 604. The compositional transition layer 610 has a composition intermediate to the first and second semiconductor materials.

In an embodiment, the compositional transition layer 610 is an alloyed layer composed of a mixture of the first and second semiconductor materials. In another embodiment, the compositional transition layer 610 is a graded layer composed of a compositional gradient of the first semiconductor material proximate to the nanocrystalline core 602 through to the second semiconductor material proximate to the nanocrystalline shell 604. In either case, in a specific embodiment, the compositional transition layer 610 has a thickness approximately in the range of 1.5-2 monolayers. Exemplary embodiments include a structure 600 where the first semiconductor material is cadmium selenide (CdSe), the second semiconductor material is cadmium sulfide (CdS), and the compositional transition layer 610 is composed of CdSexSy, where 0<x<1 and 0<y<1, or where the first semiconductor material is cadmium selenide (CdSe), the second semiconductor material is zinc selenide (ZnSe), and the compositional transition layer 610 is composed of CdxZnySe, where 0<x<1 and 0<y<1.

In accordance with an embodiment of the present invention, the compositional transition layer 610 passivates or reduces trap states where the nanocrystalline shell 604 surrounds the nanocrystalline core 602. Exemplary embodiments of core and/or shell parameters include a structure 600 where the nanocrystalline core 602 is an anisotropic nanocrystalline core having an aspect ratio between, but not including, 1.0 and 2.0 (in a specific embodiment, approximately in the range of 1.01-1.2), and the nanocrystalline shell is an anisotropic nanocrystalline shell having an aspect ratio approximately in the range of 4-6.

In an embodiment, the nanocrystalline shell 604 completely surrounds the nanocrystalline core 602, as depicted in FIG. 6. In an alternative embodiment, however, the nanocrystalline shell 604 only partially surrounds the nanocrystalline core 602, exposing a portion of the nanocrystalline core 602. Furthermore, in either case, the nanocrystalline core 602 may be disposed in an asymmetric orientation with respect to the nanocrystalline shell 604. In one or more embodiments, semiconductor structures such as 600 are fabricated to further include a nanocrystalline outer shell 606 at least partially surrounding the nanocrystalline shell 604. The nanocrystalline outer shell 606 may be composed of a third semiconductor material different from the first and second semiconductor materials, i.e., different from the materials of the core 602 and shell 604. The nanocrystalline outer shell 606 may completely surround the nanocrystalline shell 604 or may only partially surround the nanocrystalline shell 604, exposing a portion of the nanocrystalline shell 604. Lastly, an insulator layer 608 encapsulates the shell 606. In one embodiment, multiple insulator layers may be applied, up to twelve insulating layers, in one embodiment, before an additional insulator layer is applied, for example, using the ALD process, as described elsewhere herein.

In another embodiment, upon shelling of individual nanocrystals with an insulator coating such as silica to provide discrete shelled nanocrystals, a network of nanocrystals may be formed by fusing together the insulator shells of a plurality of shelled nanocrystals. For example, in accordance with an embodiment of the present invention, insulator coatings of discrete passivated nanocrystals are fused together to form a substantially rigid network of quantum dots where each quantum dot is isolated from other quantum dots in the network by the fused insulator coating. In one such embodiment, fusing together the insulator shells of discretely passivated quantum dots into a fused network provides improved optical and reliability performance of the resulting structure as compared with the starting discretely passivated quantum dots. In one such embodiment, a chemical base is used to improve the optical performance of silica shell materials by enabling the fusing of the insulator coatings surrounding a plurality of quantum dots. In a specific embodiment, the insulator coatings is a silica coating and a base such as potassium hydroxide (KOH) is used to fuse together the silica coatings of a plurality of individually and discretely coated quantum dots. The result is a substantially rigid silica-based network of quantum dots. The amount of base material is scaled with the amount of silica in the reaction. In general, the approaches described herein have important applications for improving the optical and reliability performance of quantum dots or even other phosphor materials having an insulator coating and which are embedded in a matrix. In one such embodiment, the quantum dots or other phosphor materials are first individually shelled and then the shells are fused to form an insulator network that can be embedded in a matrix. In other embodiments, the insulator network is formed directly on the quantum dots or other phosphor materials.

In an embodiment, then, with respect to using colloidal semiconductor nanocrystals, also known as quantum dots, as downshifting fluorescent materials for LED lighting and/or display technologies, quantum dots are individually coated with a silica shell. The presence of the silica shell improves the performance of the quantum dots when they are subsequently embedded in a polymer film and subjected to various stress tests. Applications include LED lighting applications and/or display configurations. The use of base (such as KOH, NaOH or other similar materials) provides a fused network of the silica shells to improve the optical performance of silica shell materials. As described below, in particular embodiments, the scaling of the amount of KOH or other base with silica content is balanced to achieve optimal performance of the shelled/fused quantum dots.

In an embodiment, a method of fabricating a semiconductor structure involves forming a mixture including a plurality of discrete semiconductor nanocrystals. Each of the plurality of discrete semiconductor nanocrystals is discretely coated by an insulator shell. The method also involves adding a base to the mixture to fuse the insulator shells of each of the plurality of discrete nanocrystals, providing an insulator network. Each of the plurality of discrete semiconductor nanocrystals is spaced apart from one another by the insulator network. The base one such as, but not limited to, LiOH, RbOH, CsOH, MgOH, Ca(OH)2, Sr(OH)2, Ba(OH)2, (Me)4NOH, (Et)4NOH, or (Bu)4NOH.

In another embodiment, a method of fabricating a semiconductor structure involves forming a mixture including a plurality of discrete semiconductor nanocrystals. Each of the plurality of discrete semiconductor nanocrystals is discretely coated by an insulator shell material. The method also involves adding a base to the mixture to fuse the insulator shells of each of the plurality of discrete nanocrystals, providing an insulator network. Each of the plurality of discrete semiconductor nanocrystals is spaced apart from one another by the insulator network. The base one such as, but not limited to, LiOH, RbOH, CsOH, MgOH, (Me)4NOH, (Et)4NOH, or (Bu)4NOH, and adding the base to the mixture involves adding one mole of the base for every two moles of the insulator shell material. The method also involves adding free silica to the mixture.

In another embodiment, a method of fabricating a semiconductor structure involves forming a mixture including a plurality of discrete semiconductor nanocrystals. Each of the plurality of discrete semiconductor nanocrystals is discretely coated by an insulator shell material. The method also involves adding a base to the mixture to fuse the insulator shells of each of the plurality of discrete nanocrystals, providing an insulator network. Each of the plurality of discrete semiconductor nanocrystals is spaced apart from one another by the insulator network. The base one such as, but not limited to, Ca(OH)2, Sr(OH)2 or Ba(OH)2, and adding the base to the mixture involves adding one mole of the base for every four moles of the insulator shell material. The method also involves adding free silica to the mixture.

In accordance with one or more embodiments herein, an alternative to altering seed size for tuning the emission of a seeded rod emitter architecture is provided. More particularly, instead of changing seed size, the seed composition is changed by alloying either the entire seed (in one embodiment) or some portion of the seed (in another embodiment) with a higher bandgap material. In either case, the general approach can be referred to as an alloying of the seed or nanocrystalline core portion of a heterostructure quantum dot. By alloying the seed or nanocrystalline core, the bandgap can be changed without changing the size of the seed or core. As such, the emission of the seed or core can be changed without changing the size of the seed or core. In one such embodiment, the size of the seed is fixed at the optimum size of a red-emitting seed, or roughly 4 nanometers. The fixed sized means that the size of the rod and the subsequent synthetic operations may not need to be substantially re-optimized or altered as the emission target of the quantum dots is changed.

Accordingly, in one or more embodiments described herein, optimum physical dimensions of a seeded rod are maintained as constant while tuning the emission peak of the heterostructure quantum dot. This can be performed without changing the dimensions of the seed (and therefore the rod) for each emission color. In a particular embodiment, a quantum dot includes an alloyed Group II-VI nanocrystalline core. The quantum dot also includes a Group II-VI nanocrystalline shell composed of a semiconductor material composition different from the alloyed Group II-VI nanocrystalline core. The Group II-VI nanocrystalline shell is bonded to and completely surrounds the alloyed Group II-VI nanocrystalline core. In one such embodiment, the alloyed Group II-VI nanocrystalline core is composed of $CdSe_nS1-n$ ($0<n<1$), and the Group II-VI nanocrystalline shell is composed of CdS. In a specific embodiment, the alloyed Group II-VI nanocrystalline core has a shortest diameter of greater than approximately 2 nanometers, and the quantum dot has an exciton peak less than 555 nanometers. In a particular embodiment, the alloyed Group II-VI nanocrystalline core has a shortest diameter of approximately 4 nanometers, and the quantum dot has an exciton peak less than 555 nanometers, as is described in greater detail below Perhaps more generally, in an embodiment, a quantum dot includes a semiconductor nanocrystalline core of arbitrary composition. The quantum dot also includes any number of semiconductor nanocrystalline shell(s). The semiconductor nanocrystalline shell(s) is/are bonded to and completely surrounds the semiconductor nanocrystalline core. In one such embodiment, the semiconductor nanocrystalline core is composed of a first Group II-VI material, and the binary semiconductor nanocrystalline shell is composed of of a second, different, Group II-VI material. In one such embodiment, the first Group II-VI material is $CdSe_nS1-n$ ($0<n<1$), and the second Group II-VI material is CdS.

One or more embodiments described herein involve fabrication of a semiconductor hetero-structure. The semiconductor hetero-structure has a nano-crystalline core composed of a group semiconductor material. A nano-crystalline shell composed of a second, different, semiconductor material at least partially surrounds the nano-crystalline core. For example, the nano-crystalline shell may be composed of a different group I-III-VI semiconductor material or of a group II-VI semiconductor material.

In one such embodiment, the above described nano-crystalline core/nano-crystalline shell pairing has a photoluminescence quantum yield (PLQY) of greater than approximately 60%. In another, or same, such embodiment, the nano-crystalline core/nano-crystalline shell pairing provides a Type I hetero-structure. One or more embodiments described herein are directed to hetero-structure systems having distinct group I-III-VI material cores. In an exemplary embodiment, a sphere or rod-shaped core/shell quantum dot is fabricated to have a sharp compositional interface between the core and shell or a graded/alloyed interface between core and shell.

Figure 7:
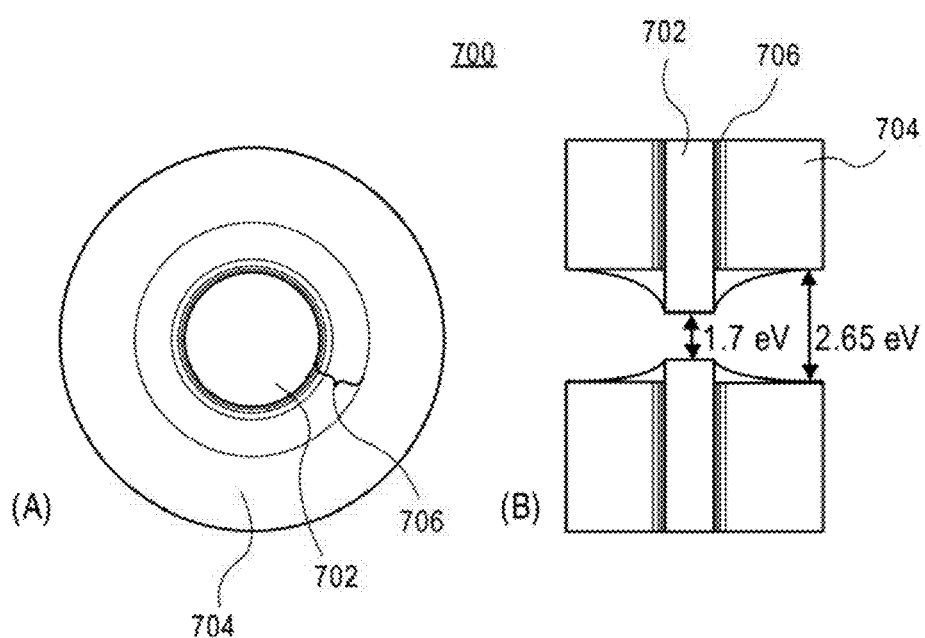
FIG. 7 illustrates a nano-particle in accordance with an embodiment of the invention.

FIG. 7 (below) illustrates an axial cross-sectional view (A) of a spherical nano-particle 700, in accordance with an embodiment of the present invention. Referring to FIG. 7, an alloy region 706 is included between the core 702 and shell 704 of 700. As shown in part (B) of FIG. 7, in one embodiment, the nano-particle 700 demonstrates type I hetero-structure behavior, with excitons preferentially recombining in the core 702 of the nano-crystal 700 due to the smaller, nested bandgap of the seed. Optionally, additional layers of material may be added, including additional epitaxial layers or amorphous inorganic and organic layers. Other suitable embodiments are described below.

In an embodiment, systems described herein include a nano-crystalline core emitter having a direct, bulk band gap approximately in the range of 1-2.5 eV. Exemplary cores include a group I-III-VI semiconductor material based on silver gallium sulfide having a stoichiometry of approximately AgGaS2. In one such embodiment, the nano-crystalline core has a peak emission approximately in the range of 475-575 nanometers.

In one or more embodiments, the nano-crystalline core and nano-crystalline shell pairings described herein have a lattice mismatch of equal to or less than approximately 10%. In some embodiments, less than approximately 6% mismatch is preferable, but up to approximately 10% can be workable. In particular embodiments, the mismatch is less than approximately 4% mismatch, as seen in successful Cd-based systems.

One or more embodiments described herein is directed to a hetero-structure core/shell pairing that is cadmium-free. For example, with reference to the above described nano-crystalline core and nano-crystalline shell pairings, in an embodiment, the first (core) material is a group I-III-VI semiconductor material. In one such embodiment, the second (shell) semiconductor material is a second group I-III-VI material. For example, a suitable I-III-VI/I-III-VI core/shell pairing can include, but is not limited to, copper indium sulfide (CIS)/silver gallium sulfide (AgGaS2), copper indium selenide (CISe)/AgGaS2, copper gallium selenide (CuGaSe2)/copper gallium sulfide (CuGaS2), or CuGaSe2/AgGaS2. In another such embodiment, the second (shell) semiconductor material is a group II-VI material. For example, a suitable I-III-VI/II-VI core/shell pairing can include, but is not limited to, copper indium sulfide (CIS)/zinc selenide (ZnSe), CIS/zinc sulfide (ZnS), copper indium selenide (CISe)/ZnSe, CISe/ZnS, copper gallium selenide (CuGaSe2)/ZnSe, CuGaSe2/ZnS, silver gallium sulfide (AgGaS2)/ZnS, AgGaS2/ZnSe, or silver gallium selenide (AgGaSe2)/ZnS, AgGaSe2/ZnSe.

In an embodiment, the semiconductor hetero-structure further includes a nano-crystalline outer shell composed of a third semiconductor material different from the core and shell semiconductor materials. The third semiconductor material at least partially surrounding the nano-crystalline shell and, in one embodiment, the nano-crystalline outer shell completely surrounds the nano-crystalline shell. In a particular embodiment, the second (shell) semiconductor material one such as, but not limited to, zinc selenide (ZnSe), silver gallium sulfide (AgGaS2) or copper gallium sulfide (CuGaS2), and the third (outer shell) semiconductor material is zinc sulfide (ZnS).

The methods described herein are not limited by the shape of the quantum dot and could be applied to coated quantum dots of multiple shapes, including spheres, rods, tetrapods, teardrops, sheets, etc. It is not limited by the composition of the quantum dot and can be applied to quantum dots made from a single material or multiple materials in either a core/shell/optional shell/optional shell configuration or an alloyed composition. The semiconductor materials may be selected from the Group II-VI compounds, Group III-V compounds, group IV-IV compounds, group I-III-VI compounds, or any alloy thereof. More specifically the semiconductor materials may be chosen from ZnO, ZnS, ZnSe, ZnTe, CdO, CdS, CdSe, CdTe, HgS, HgSe, HgTe, HgO, AN, AlP, AlAs, AlSb, GaN, GaP, GaAs, GaSb, GaSe, InN, InP, InAs, InSb, TlN, TlP, TlAs, TlSb, PbS, PbSe, PbTe, MgO, MgS, MgSe, alloys thereof, and mixtures thereof.

What is claimed is:

1. A method of fabricating a semiconductor structure, comprising:
   forming a nanocrystalline core from a first semiconductor material;
   forming at least one nanocrystalline shell from a second, different, semiconductor material that at least partially surrounds the nanocrystalline core, wherein the nanocrystalline core and the nanocrystalline shell(s) form a quantum dot;
   forming at least one first metal oxide layer encapsulating the quantum dot to create a coated quantum dot; and
   forming at least one second metal oxide layer on the coated quantum dot using an Atomic Layer Deposition (ALD) process, wherein the first metal oxide layer(s) acts an adjustable spacer that allows the coated quantum dot to remain fully dispersed and spaced apart with respect to any other quantum dots in the semiconductor structure prior to forming the second metal oxide layer(s) encapsulating the quantum dot using the ALD process.

2. The method of claim 1, wherein forming the at least one first metal oxide layer encapsulating the quantum dot comprises forming a plurality of first metal oxide layers encapsulating the quantum dot to create a coated quantum dot.

3. The method of claim 1, wherein forming the at least one first metal oxide layer encapsulating the quantum dot comprises selecting the at least one first metal oxide layer from a group of metal oxides consisting of silica ($SiO_x$), titanium oxide ($TiO_x$), zirconium oxide ($ZrO_x$), alumina ($AlO_x$), magnesium oxide ($MgO_x$) and hafnia ($HfO_x$).

4. The method of claim 1, wherein forming the at least one second metal oxide insulator layer on the coated quantum dot using an Atomic Layer Deposition (ALD) process comprises introducing the coated quantum dot to an atomic layer deposition (ALD) reactor wherein the forming of the at least one second metal oxide layer on the coated quantum dot using the Atomic Layer Deposition (ALD) process is performed.

5. A method of fabricating a semiconductor structure, comprising:
   forming a nanocrystalline core from a first semiconductor material;
   forming at least one nanocrystalline shell from a second, different, semiconductor material that at least partially surrounds the nanocrystalline core, wherein the nanocrystalline core and the nanocrystalline shell(s) form a quantum dot;
   forming at least one first metal oxide layer encapsulating the quantum dot to create a coated quantum dot; and
   forming a plurality of second metal oxide layers on the coated quantum dot using the ALD process, wherein forming the plurality of second metal oxide layers on the coated quantum dot comprises forming alternating organic layers and inorganic layers on the coated quantum dot using the ALD process.

6. The method of claim 5, wherein the forming the organic layers comprises forming a layer of poly(p-xylylene) polymer.

7. The method of claim 6, wherein forming the layer of poly(p-xylylene) polymer comprises forming the layer of poly(p-xylylene) polymer by vapor-phase deposition process at room temperature.

8. The method of claim 5, wherein forming the inorganic layers comprises forming a layer with a compound or metal selected from a group of compounds and metals consisting of $Al_2O_3$, MgO, $SiO_x$, and $SiN_x$, copper, cobalt, and iron.

* * * * *